(12) United States Patent
Snider et al.

(10) Patent No.: US 11,488,660 B2
(45) Date of Patent: Nov. 1, 2022

(54) ADIABATIC FLIP-FLOP AND MEMORY CELL DESIGN

(71) Applicants: Indiana Integrated Circuits, LLC, South Bend, IN (US); University of Notre Dame du Lac, Notre Dame, IN (US)

(72) Inventors: Gregory Snider, Niles, MI (US); Rene Celis-Cordova, South Bend, IN (US); Alexei Orlov, South Bend, IN (US); Tian Lu, Osceola, IN (US); Jason M. Kulick, South Bend, IN (US)

(73) Assignees: INDIANA INTEGRATED CIRCUITS, LLC, South Bend, IN (US); UNIVERSITY OF NOTRE DAME DU LAC, Notre Dame, IN (US)

( * ) Notice: Subject to any disclaimer, the term of this patent is extended or adjusted under 35 U.S.C. 154(b) by 99 days.

(21) Appl. No.: 17/179,478

(22) Filed: Feb. 19, 2021

(65) Prior Publication Data
US 2021/0327496 A1    Oct. 21, 2021

Related U.S. Application Data

(60) Provisional application No. 63/012,367, filed on Apr. 20, 2020.

(51) Int. Cl.
*H03K 3/037* (2006.01)
*G11C 11/412* (2006.01)

(52) U.S. Cl.
CPC .......... *G11C 11/412* (2013.01); *H03K 3/0372* (2013.01)

(58) Field of Classification Search
CPC ...... H03K 3/027; H03K 3/037; H03K 3/0372; H03K 3/353; H03K 3/356; H03K 3/356104; H03K 3/3562; H03K 3/35625; H03K 19/0019; G11C 11/34; G11C 11/40; G11C 11/41; G11C 11/412; G11C 11/4125

See application file for complete search history.

(56) References Cited

U.S. PATENT DOCUMENTS

2016/0094221 A1* 3/2016 Wang ................. H03K 19/0013
326/59

* cited by examiner

*Primary Examiner* — Long Nguyen
(74) *Attorney, Agent, or Firm* — The Webb Law Firm

(57) ABSTRACT

In a method computer storage element operation, first and second rising (or falling) clock edges are applied to first and second power inputs of the computer storage element having a transistor array between the first and second power inputs over time T1 whereupon a logic value applied to an input of the transistor array is stored therein. Thereafter, first and second falling (or rising) clock edges are applied to the first and second power inputs over time T2, whereupon part of an electrical charge or energy associated with the logic value stored in the transistor array is provided to circuitry that generates the first and/or second clock edge(s), wherein the value(s) of time T1 and/or time T2 is/are greater than a product of RC, where R is resistance associated with the computer storage element, and C is a load capacitance associated with the computer storage element.

2 Claims, 8 Drawing Sheets

ADIABATIC FLIP-FLOP AND MEMORY CELL DESIGN

CROSS REFERENCE TO RELATED APPLICATION

This application claims the benefit of U.S. Provisional Patent Application No. 63/012,367, filed Apr. 20, 2020, the disclosure of which is incorporated herein by reference.

GOVERNMENT RIGHTS

This invention was made with government support under FA9453-19-P-0519 awarded by the United States Air Force. The government has certain rights in the invention.

BACKGROUND OF THE INVENTION

Field of the Invention

This invention relates to logic circuits and, more particularly, to an adiabatic flip-flop and memory cell design and a method of use thereof.

Description of Related Art

Despite the exponential progress over the past fifty years the increase of performance of computing devices is coming to an end. Modern microprocessors are limited by heat generation, and their speeds have been capped at 4 GHz since 2004. Traditional Complementary MOSFET logic (CMOS) circuits dissipate energy every time they switch in the form of heat. CMOS devices switch using sharp transitions and yield the following equation for their dissipation energy:

$$E_{CMOS} = \tfrac{1}{2} C V_{DDhu\,2} \quad (1)$$

Here, C is the load capacitance of the logic gate, and $V_{DD}$ is the power supply. The energy is discarded and dissipated into heat after each switching event, therefore imposing a speed limit on the operation of modern computing devices. A diagram of a traditional CMOS inverter is presented in FIG. 1A and its timing diagram is presented in FIG. 1B.

Adiabatic reversible computing is a viable alternative to traditional circuit implementations since it reduces heat generation by avoiding unnecessary dissipation. Adiabatic reversible computing, or simply adiabatic computing, uses reversible logic and quasi-adiabatic transitions to reduce heat generation by introducing a trade-off between speed and power. This can be implemented by using a slowly ramping clock as a voltage supply yielding the following expression for energy dissipation:

$$E_{adiabatic} = C V_t^2 \frac{RC}{T}. \quad (2)$$

Here, R is the resistance of the logic gate, C is the load capacitance of the logic gate, $V_t$ is the ramping power supply, RC is the intrinsic time constant of the gate, and T is the ramping time of the power supply from a null value, e.g., 0 volts, to $V_t$, or vice versa. The term including the RC time constant of the gate and the ramping time T of the power supply allows for further reduction in the dissipation energy. When T is much lower than the RC time constant of the gate, energy recovery can be enhanced and energy dissipation can be reduced considerably. Stated differently, the larger the value is of the inverse of the ratio RC/T, i.e., T/RC, the more energy may be recovered from the logic gate and less energy may be dissipated by the logic gate.

Adiabatic computing can be implemented as split-rail charge recovery logic (SCRL). An inverter using adiabatic SCRL logic is shown in FIG. 2A, where the power supply and ground terminals have been replaced by positive and negative ramping clocks with a ramping period T. As seen in FIG. 2B, both ramping clocks CLK1+ and CLK1− start at a null state (0 Volts), then ramp up and down, respectively, to VDD and VSS for time T until reaching a valid logic state, retain the logic value for some period, and ramp back down and up, respectively, for time T to the null state recovering at least some of the energy from the illustrated inverter. The energy recovery step helps avoid energy dissipation, but information is lost between cycles since the inverter returns to a null state. During the computing stages, the output of the inverter will follow either the positive or the negative clock to represent a logical '1' or a logical '0'.

Since the logic values of SCRL gates are not valid when the clocks are ramping up and down, or during the null state, any following gates will require clocks with a different phase. In some non-limiting embodiments or examples, the null state can be 0 Volts. However, this is not to be construed in a limiting sense, since the null state may be another suitable and/or desirable voltage value selected by one skilled in the art, e.g., for a particular application.

A chain of three SCRL inverters is shown in FIG. 3A, which illustrates the use of the phased clocks shown in FIG. 3B to power different stages of the circuit. This clocking scheme shown in FIG. 3B is known as Bennett clocking, which consists of clocks that only ramp up once the previous stage has a valid state. Similarly, during the energy recovering process the last level of logic ramps down first, and once the null state is reached the previous stage follows. Bennett clocking ensures that the logical input values of the circuit are valid during the compute and the energy recovery steps, and presents a straightforward implementation to adiabatic computing.

Even though adiabatic microprocessors using SCRL circuits as described above have been successfully implemented, sequential elements were not implemented using adiabatic logic. Modern CMOS circuits have both combinational logic, such as the non-liming three-inverter chain shown in FIG. 3A, and sequential logic that includes memory elements to store the results obtained by the combinational logic. This is illustrated in FIGS. 4A-4B, which shows that multiple combinational logic blocks can use the same set of Bennett clocks while their intermediate results are stored in sequential (memory) elements. The sequential elements can be registers comprised of flip flop gates, or memory elements comprised of SRAM cells. These sequential elements may sample the result of the combinational logic during a valid period, when all clocks have ramped up, and will provide the result as an input to the next set of combinational logic at the next cycle.

Herein, disclosed are designs of example sequential elements, in particular, an example flip-flop and an example SRAM cell that can implement adiabatic computing using SCRL logic. The example adiabatic flip-flop and memory designs are believed to be the first examples of sequential elements that may be used in any practical implementation of adiabatic computing, such as adiabatic microprocessors. Adiabatic microprocessors using the proposed sequential elements may fully implement adiabatic computing.

SUMMARY OF THE INVENTION

Generally, provided, in some non-limiting embodiments or examples, is a computer storage element and method of use thereof. In some non-limiting embodiments, the computer storage element may be a flip-flop or memory. In some non-limiting embodiments, the computer storage element may be operated in a manner that reduces, minimizes, or avoids electrical power from entering the computer storage element and thereby power consumption and, hence, heat generation in the computer storage element over prior methods of use.

Further preferred and non-limiting embodiments or examples are set forth in the following numbered clauses Clause 1: A method comprising: (a) in a computer storage element having first and second power inputs separated by an array of transistors of the computer storage element configured for storing a computer bit of data, applying to an input of the array of transistors a logic value "1" or "0"; (b) concurrent with step (a), applying to the first power input a first clock signal having a leading edge that changes from a null value to VDD, or vice versa, over a time period T1; (c) concurrent with step (b), applying to the second power input a second clock signal having a leading edge that changes from the null value to VSS, or vice versa, over the time period T1, whereupon the logic value applied to the input of the array of transistors is stored in the array of transistors; (d) following step (c), causing the first clock signal to change from VDD to the null value, or vice versa, over a time period T2; and (e) concurrent with step (d), causing the second clock signal to change from VSS to the null value, or vice versa, over the time period T2, whereupon a portion or part of electrical charge or energy associated with the logic value stored in the array of transistors is provided to circuitry that generates the first clock signal, the second clock signal, or both the first and second clock signals, wherein the value of time periods T1, or time period T2, or both time periods T1 and T2 is/are greater than a product of RC, where R is resistance associated with the computer storage element, and C is a load capacitance associated with the computer storage element.

Clause 2: A method comprising: (a) in a computer storage element having first and second clock inputs separated by an array of transistors of the computer storage element storing a first bit of data applied to a bit input, applying to the first clock input a first clock signal having a leading edge that changes from a null value to VDD, or vice versa, over a time period T1; (b) concurrent with step (a), applying to the second clock input a second clock signal having a leading edge that changes from the null value to VSS, or vice versa, over the time period T1, whereupon a portion or part of electrical charge or energy associated with the first bit of data stored in the array of transistors is provided to circuitry that generates the first clock signal, the second clock signal, or both the first and second clock signals; (c) following step (b), causing a second bit of data to be stored in the array of transistors; and (d) following step (c), causing, over the time period T2, the first clock signal to return from VDD back to the null value, or vice versa, and the second clock signal to return from VSS back to the null value, or vice versa, whereupon the logic value applied to the bit input is stored in the array of transistors, wherein the value of time period T1, or time period T2, or both time periods T1 and T2 is/are greater than a product of RC, where R is resistance associated with computer storage element, and C is a load capacitance associated with computer storage element.

BRIEF DESCRIPTION OF THE DRAWINGS

These and other features of the present invention will become more apparent from the following description wherein reference is made to the appended drawings wherein.

DESCRIPTION OF THE INVENTION

The timing requirements for sequential elements separating Bennett clocked combinational logic is somewhat complicated since the data should be latched in when the Bennett clock phases are all active, but the data should not appear on the latch output until all Bennett phases have ramped back down, e.g., to their null states. This can be accomplished by using a master-slave flip-flop as the sequential element. We present the design of an energy-recovery, adiabatic, master-slave flip-flop compatible with SCRL logic.

Figures 1A, 1B:
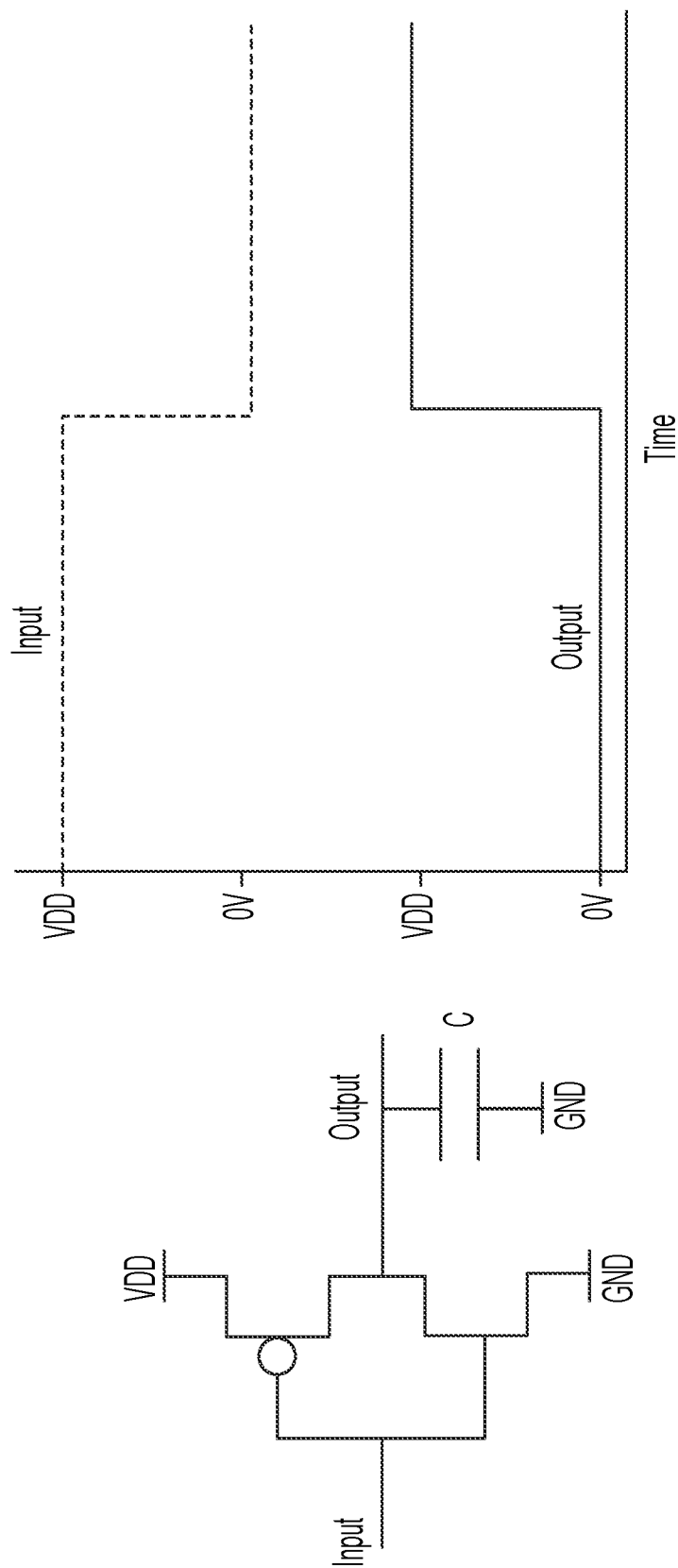
FIG. 1A is schematic drawing of a traditional CMOS inverter.
FIG. 1B is a timing diagram for the CMOS inverter of FIG. 1A.
Figure 2B:
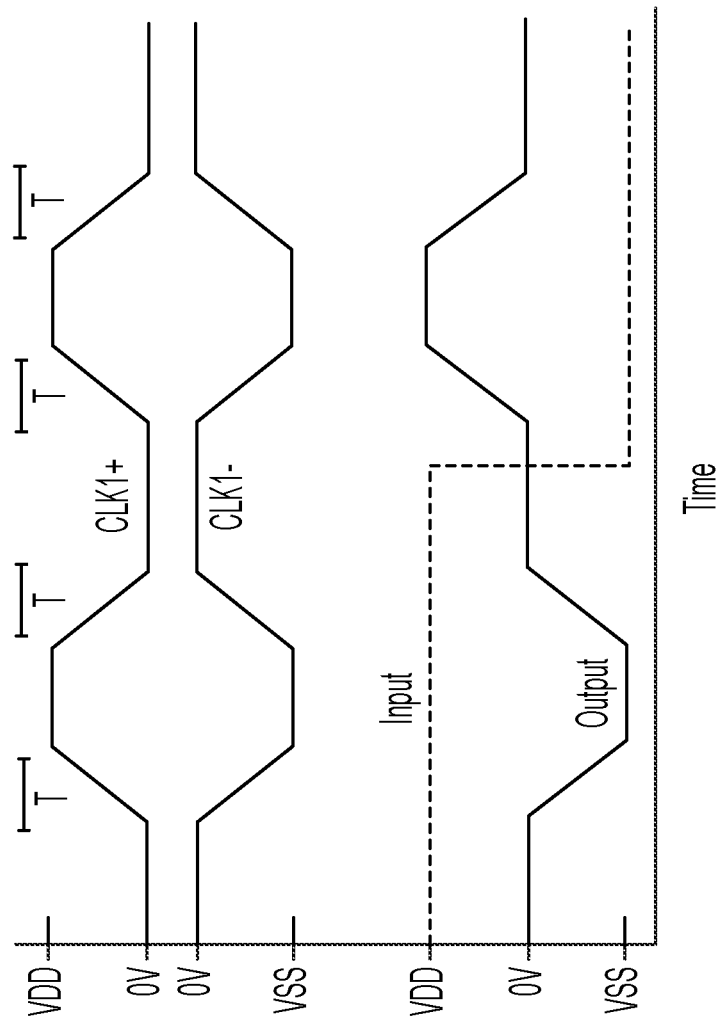
FIG. 2B is a timing diagram for the Adiabatic inverter of FIG. 2A.
Figure 2A:
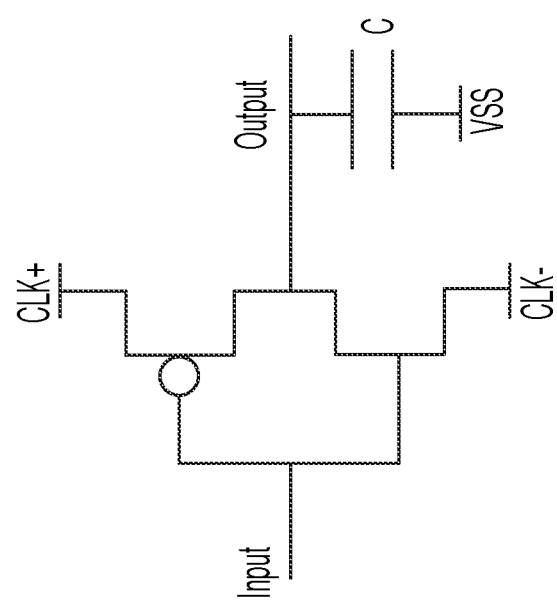
FIG. 2A is schematic drawing of an Adiabatic inverter implemented with split-rail charge recovery logic (SCRL)
Figure 3B:
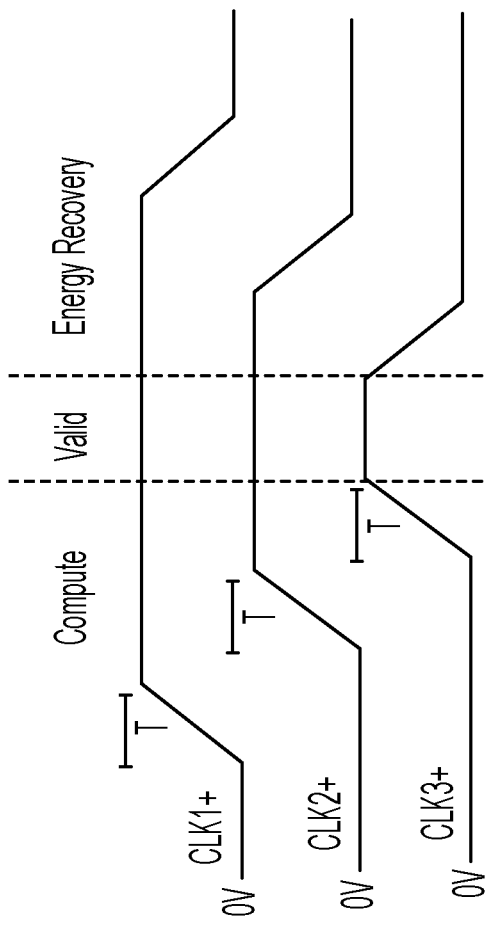
FIG. 3B is a timing diagram of Bennett clocking for the three SCRL inverters of FIG. 3A.
Figure 3A:
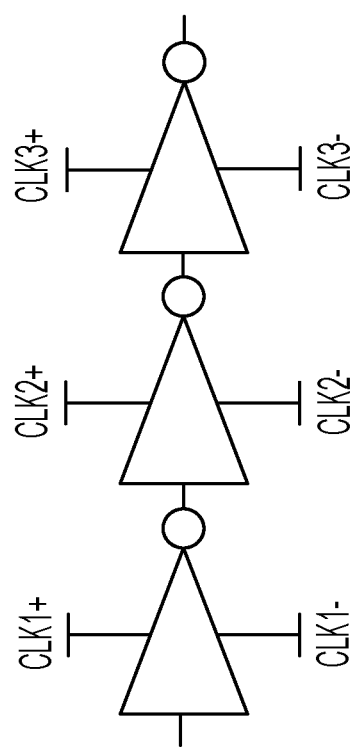
FIG. 3A is a schematic drawing of three SCRL inverters connected in series.
Figure 4A:
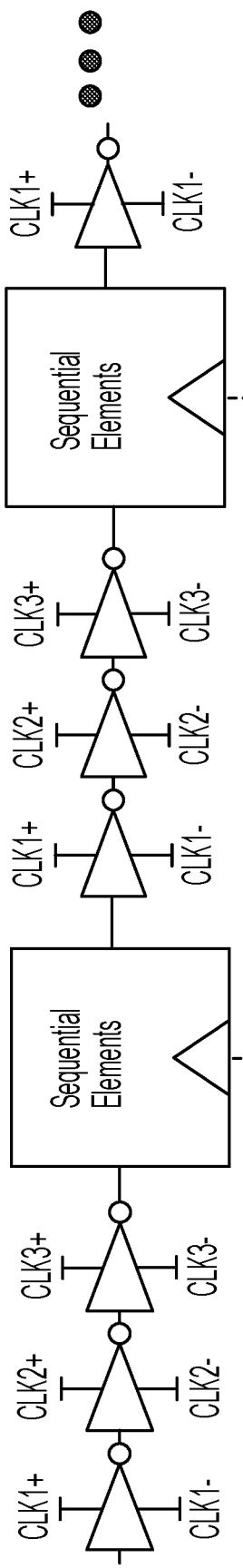
FIG. 4A is a schematic drawing of adiabatic SCRL circuits and sequential elements connected in series.
Figure 4B:
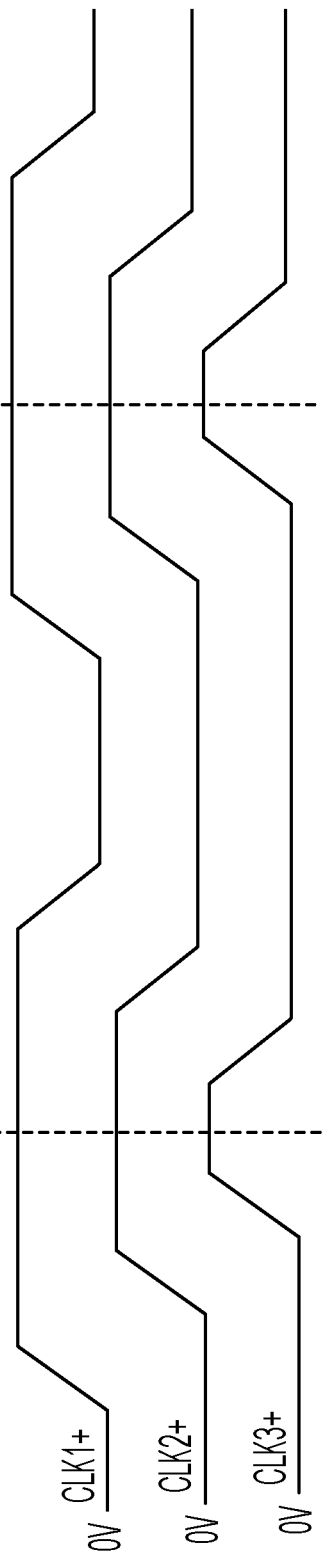
FIG. 4B is a timing diagram for the sequential elements of FIG. 4A.
Figure 5A:
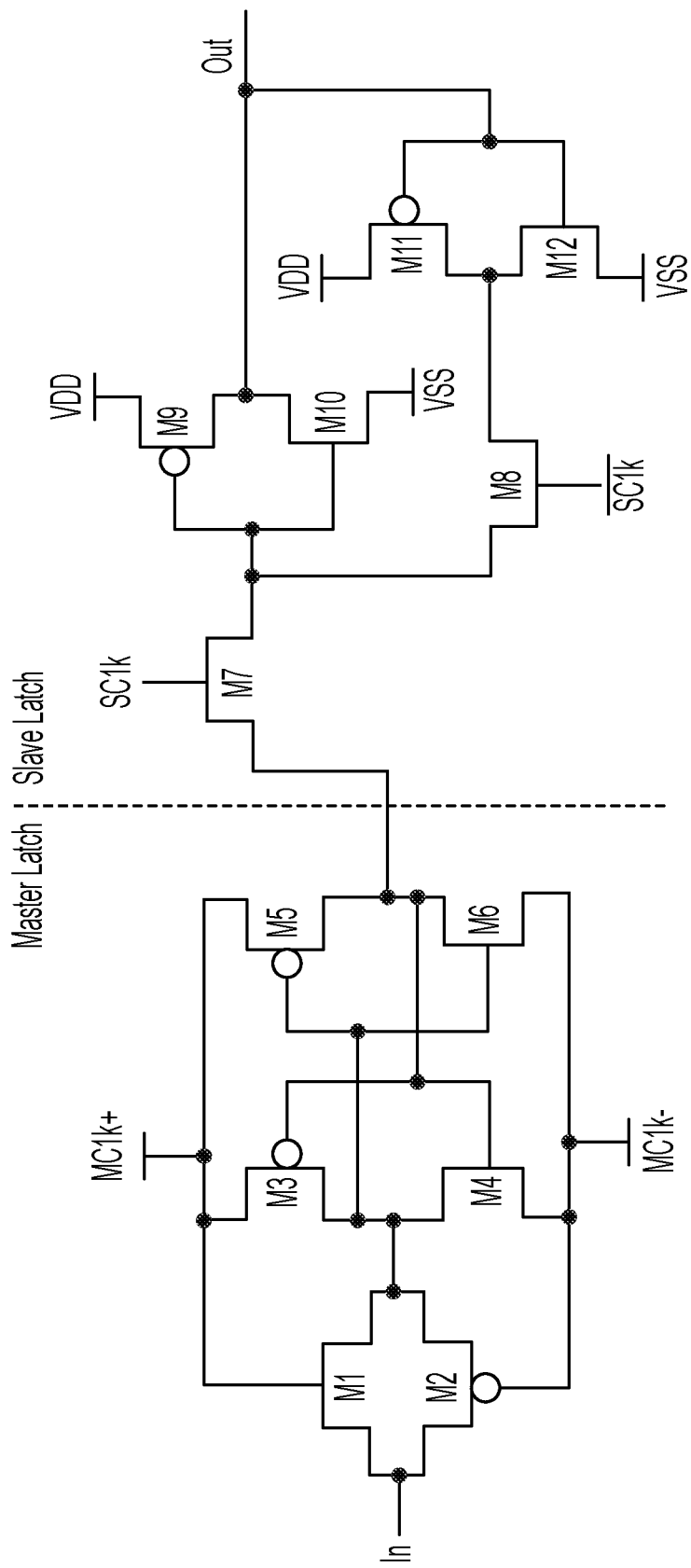
FIG. 5A is a schematic drawing of an adiabatic master-slave flip-flop in accordance with the principles of the present invention.

The design of a non-limiting example adiabatic master-slave flip-flop is presented in FIG. 5A. The design starts with an energy recovery master latch as the master stage, and a conventional CMOS latch as the slave stage, left-side and right-side, respectively. While there is destruction of information at the latches, necessitating some energy loss, the energy recovering stage helps to minimize the loss.

The adiabatic flip-flop comprises twelve transistors as seen in FIG. 5A. Transistors M2, M3, M5, M9, and M11 are p-channel MOSFETs; while the transistors M1, M4, M6, M7, M8, M10, and M12 are n-channel MOSFETs. The input is passed through a transmission gate comprised of transistors M1 and M2, which are controlled by the positive and negative master clocks (MClk+ and MClk−). Transistors M3, M4, M5 and M6 form the master latch that performs energy recovery but does not retain information. The slave latch retains information by using an abrupt clock pulse that senses the data using the slave clocks (SClk+ and SClk−) with transistors M7 and M8. Finally, transistors M9, M10, M11, and M12 form the slave latch that retains information while the combinational Bennett clocks are at a null state.

Figure 5B:
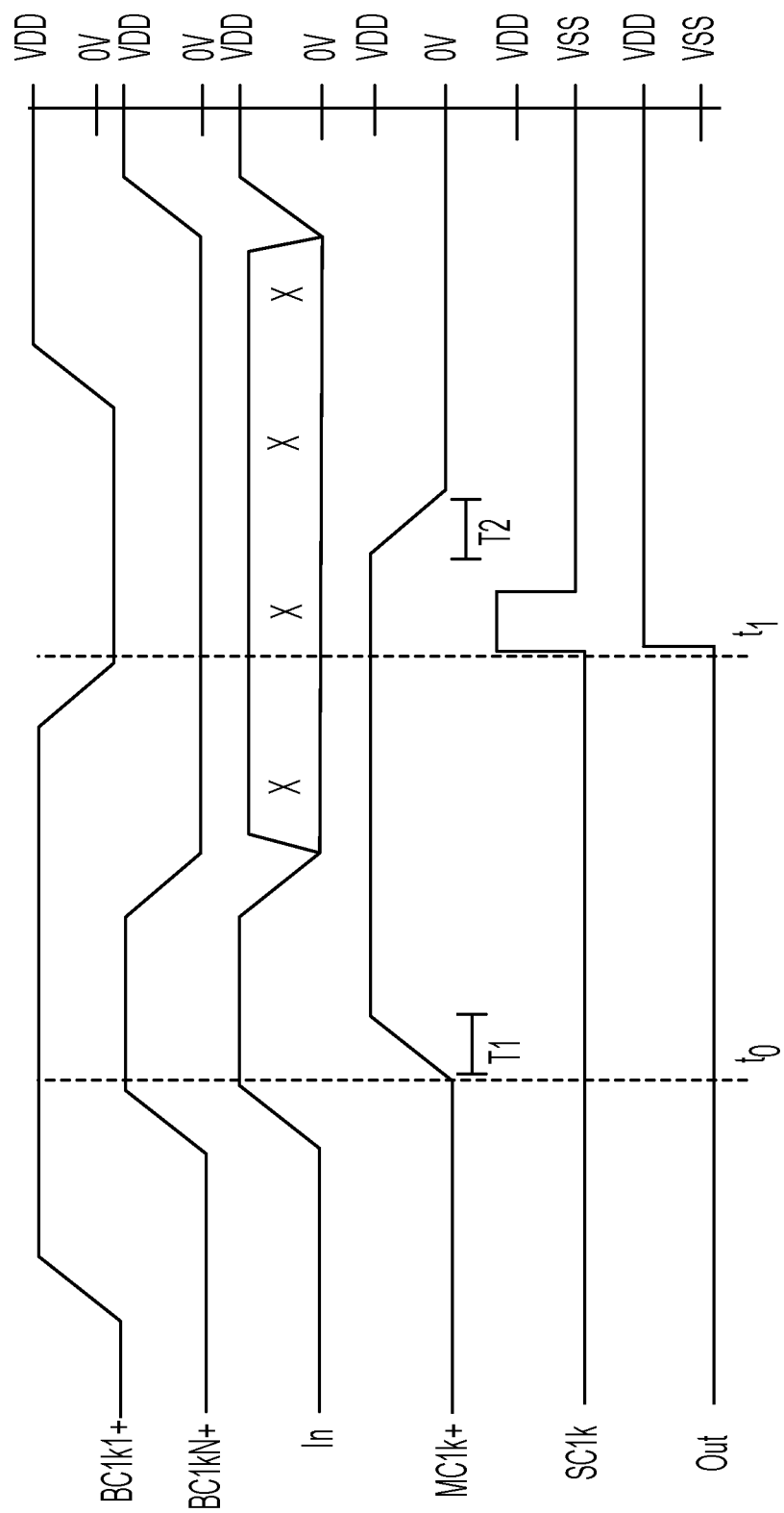
FIG. 5B is a timing diagram, in accordance with the principles of the present invention, for the adiabatic master-slave flip-flop of FIG. 5A.

A non-limiting example timing diagram of the master-slave flip-flop is presented in FIG. 5B. The master clock, MClk, of the master latch is ramped up when all the phases of the Bennett clocks have ramped up, and the data from the logic block is valid, labeled as time t0. The master clocks MClk+ and MClk− are then held active until the Bennett phases have all ramped down to a null state. At this point, labeled t1, an abrupt clock pulse (SClk) is applied to the slave latch and it inputs the data into the slave latch, passing the information to the next Bennett logic block. The information is retained in the slave latch while the combinational logic is at the null state. The inverse, $\overline{\text{SClk}}$, of the slave clock SClk is omitted from the timing diagram, but it is used to drive the gate of transistor M8 to control the input of the slave latch. The negative master clock MClk− is also omitted from the timing diagram in FIG. 5B, but it follows the same behavior as the Bennett clocks, e.g., the master clock MClk+, described above. This latching scheme recovers part of the bit energy in the master latch, but none of the bit energy in the slave latch, since an abrupt clock is used but it still proves beneficial.

FIG. 5B shows example clock signals for BClk1+ and BClkN+. These clock signals, BClk1+ and BClkN+, and their inverse (negative) clocks, BClk1− and BClkN− (not shown), are for a plurality of unillustrated instances of the adiabatic master-slave flip-flop design shown in FIG. 5A that precede, in series, the illustrated adiabatic master-slave flip-flop shown in FIG. 5A. In an example where there are first and second unillustrated adiabatic master-slave flip-flops that precede, in series, the illustrated adiabatic master-slave flip-flop shown in FIG. 5A, the "In" of the first unillustrated instance of the adiabatic master-slave flip-flop receives a digital input "1" or "0" from an external source, the "Out" of the first unillustrated instance of the adiabatic master-slave flip-flop is coupled to the "In" of the second unillustrated instance of the adiabatic master-slave flip-flop, the "Out" of which is connected to the "In" of the adiabatic master-slave flip-flop shown in FIG. 5A.

Having thus generally described the example adiabatic master-slave flip-flop shown in FIG. 5A and its timing diagram in FIG. 5B, an example operation of this master-slave flip-flop will now be described with reference to the timing diagram, wherein, in FIG. 5A, MClk− (not specifically shown) is the inverse of MClk+, i.e., when MClk+ is 0V and VDD, MClk− is 0V and −VDD, respectively, and $\overline{\text{SClk}}$ (not specifically shown) is the inverse of SClk, i.e., when SClk is VDD and VSS, $\overline{\text{SClk}}$ is VSS and VDD, respectively.

In FIG. 5B, clock signals BClk1+, BClkN+. MClk+, and SClk, and their respective inverses BClk1−, BClkN−. MClk−, and $\overline{\text{SClk}}$ (not shown) can be generated by an external logic circuit that is not shown for the purpose of simplicity. However, it is envisioned that this external logic circuit may include logic circuits and/or a microprocessor programmed or configured to provide these clock signals and their respective inverses. In FIG. 5B, the "X"s associated with "In" indicates that the state of "In" during the corresponding period of time is not important since the values or states of MClk+ and MClk− are not changing during this period of time.

Referring now to FIGS. 5A and 5B, in general, the arrangement and connection of transistors M1-M2 define a transmission gate, the arrangement and connections of transistors M3-M4 generally define a first storage cell or first data retention means, the arrangement and connections of transistors M5-M6 generally define a first inverter, the arrangement and connections of transistors M9-M10 generally define a second inverter, and the arrangement and connection of transistors M11-M12 generally define a second storage cell or second data retention means.

In response to the input of a first logic level, e.g., logic level 1 (e.g., VDD), into input "In" prior to time t0 and, beginning at time t0, the subsequent change over a period of time T1 of the value of MClk+ from 0V to VDD and the corresponding change over the period of time T1 of the value of MClk− (not shown) from 0V to VSS, i.e., at the leading edges of MClk+ and MClk−, transistors M1 and M2 turn on or enter a conducting state. With transistors M1 and M2 on, the logic level 1 at "In" appears at the source-drain junction between transistors M3 and M4 and the gates of transistors M5 and M6.

Transistors M3 and M4, operating as a first retention or storage cell, retain the logic level 1 appearing at the source-drain junction between transistors M3 and M4 until the trailing edges of MClk+ and MClk− return to 0V, following the abrupt clock pulse SClk and its inverse $\overline{\text{SClk}}$ changing from VSS to VDD (SClk) and back, and from VDD to VSS ($\overline{\text{SClk}}$) and back beginning at time t1. Transistors M5 and M6, operating as the first inverter, invert the logic level 1 appearing at their gates to a logic level 0 at their source-drain junction until the trailing edges of MClk+ and MClk− return to 0V, following trailing edge of the abrupt clock pulse SClk and its inverse $\overline{\text{SClk}}$.

Following the time period T1 of MClk+ and MClk−, the logic level at the input "In" is returned to a null logic state (e.g., don't care state). This change in the logic level at the input "In", however, has no effect on the logic levels of the first retention cell and the first inverter since the values of MClk+ and MClk− are not changing.

Beginning at time t1, the values of SClk and $\overline{\text{SClk}}$ are pulsed changing values from VSS to VDD (for SClk) and back and from VDD to VSS (for $\overline{\text{SClk}}$) and back, whereupon the logic level 0 appearing at the source-drain junction between transistors M5 and M6 is clocked via transistors M7 and M8 to the gate inputs of transistors M9 and M10 and the source-drain junction between transistors M11 and M12. Transistors M9 and M10 invert this logic level 0 to a logic level 1 and transistors M11 and M12 retain or latch this logic level 1 at "Out".

In an example, in response to the leading and trailing edges of the abrupt clock pulses SClk and $\overline{\text{SClk}}$ the logic level output at "Out" is set or latched to the same logic value as the logic level input to "In", e.g., in this example, a logic level 1.

Following the trailing edges of the SClk and $\overline{\text{SClk}}$ pulses, the values of MClk+ and MClk− are returned at their trailing edges to their starting values, namely, 0V, over of period of time T2, which may be the same or different than time period T1. It is during the time period T2, that at least part of the electrical charge or energy residing in the first storage or retention cell, i.e., transistors M3 and M4, and the electrical charge or energy residing in the first inverter, i.e., transistors M5 and M6, is recovered by return of electrical charge or energy to the logic circuitry (not shown) that generates MClk+ and MClk−.

Following the trailing edges of MClk+ and MClk−, the sequence of signals beginning with the leading edge of BClk1+ (and its inverse BClk1−) through the trailing edge of MClk+ (and its inverse MClk−) can be repeated as deemed suitable and/or desirable for one or more subsequent logic level inputs, i.e., "1" or "0", into input into "In". However, this is not to be construed in a limiting sense.

For example, in response to the input of a second logic level, e.g., logic level 0 (e.g., VSS), into input "In" prior to an instance of time t0, and beginning at time t0, the subsequent change over a period of time T1 of the value of MClk+ from 0V to VDD and the corresponding change over the period of time T1 of the value of MClk− from 0V to VSS, i.e., at the leading edges of MClk+ and MClk−, transistors M1 and M2 turn on or enter a conducting state. With transistors M1 and M2 on, the logic level 0 at "In" appears at the source-drain junction between transistors M3 and M4 and the gates of transistors M5 and M6.

Transistors M3 and M4, operating as a first retention or storage cell, retain the logic level 0 appearing at the source-drain junction between transistors M3 and M4 until the trailing edges of MClk+ and MClk− return to 0V, following the abrupt clock pulse SClk and its inverse $\overline{SClk}$ changing from VSS to VDD (SClk) and back, and changing from VDD to VSS ($\overline{SClk}$) and back beginning at time t1. Transistors M5 and M6, operating as the first inverter, invert the logic level 0 appearing at their gates to a logic level 1 at their source-drain junction until the trailing edges of MClk+ and MClk− return to 0V, following the trailing edge of the abrupt clock pulse SClk and its inverse $\overline{SClk}$.

Following the time period T1, the logic level at the input "In" is returned to a null logic state (e.g., don't care). This change in the logic level at the input "In", however, has no effect on the logic levels of the first retention cell and the first inverter since the values of MClk+ and MClk− are not changing.

Beginning at time t1, the values of SClk and $\overline{SClk}$ are pulsed changing values from VSS to VDD and back (for SClk) and from VDD to VSS (for $\overline{SClk}$) and back, whereupon the logic level 1 appearing at the source-drain junction between transistors M5 and M6 is clocked via transistors M7 and M8 to the gate inputs of transistors M9 and M10 and the source-drain junction between transistors M11 and M12. Transistors M9 and M10 invert this logic level 1 to a logic level 0 and transistors M11 and M12 retain or latch this logic level 0 at "Out".

In an example, in response to the leading and trailing edges of the abrupt clock pulses SClk and $\overline{SClk}$, the logic level output at "Out" is set or latched to the same logic value as the logic level input to "In", e.g., in this example, a logic level 0.

While not wishing to be bound by any particular theory, it is believed that the time period(s) T1, or T2, or both T1 and T2 is/are tradeoffs between switching speed and power dissipation. For example, it is believed that longer time period(s) T1, or T2, or both T1 and T2 for MClk+ and MClk− result in electrical charge moving more gradually between the external logic circuit that generates MClk+ and MClk− and at least transistors M3-M6 of the Master Latch, with the result being that for time period T2 less energy is dissipated, e.g., by the resistive, capacitive, and/or inductive elements of the Master Latch, and more electrical charge is recovered by at least the portion of the external logic circuit that generates MClk+ and MClk−.

In contrast, shorter time period(s) T1, or T2, or both T1 and T2 for MClk+ and MClk− result in charge moving more quickly to and from the external logic circuit that generates MClk+ and MClk− and at least transistors M3-M6 of the Master Latch. As a result, more power is dissipated, e.g., by the resistive, capacitive, and/or inductive elements of the Master Latch, during this movement of charge and less charge is recovered by at least the portion of the external logic circuit that generates MClk+ and MClk−.

In some non-limiting embodiments or examples, the time period T1 can range between one picosecond to 100 seconds, or between one picosecond to one millisecond, or between one nanosecond to 100 milliseconds. Similarly, time period T2 can range between one picosecond to 100 seconds, or between one picosecond to one millisecond, or between one nanosecond to 100 milliseconds. However, these values are exemplary only and are not to be construed in a limiting sense. Moreover, T1 and T2 may be the same or different time periods.

In some non-limiting embodiments or examples, the value of T in equation (2) above, which can represent time period(s) T1 and/or T2 in the above flip-flop example, may be tuned or selected such that the value of the inverse of RC/T, i.e., T/RC, is between 2-5000, or is between 2-100, or is between 2-50. However, this is not to be construed in a limiting sense since the value of T, i.e., time period(s) T1 and/or T2 in the above flip-flop example, may be tuned or selected to be any suitable and/or desirable value deemed suitable and/or desirably by one of ordinary skill in the art, e.g., for a particular application and/or based on practicable considerations in the design of the external logic circuit. In an example, the larger the value of T/RC is, the more energy is recovered by the external logic circuit and the less energy is dissipated by the flip-flop shown in FIG. 5A, in particular transistors M3-M6 of the Master Latch shown in FIG. 5A.

With regard to the above flip-flop example and the variables R and C in equation (2) above, the value of R in equation (2) may be the resistance between the terminals for MClk+ and MClk− at least during time period T2 and the value of C in equation (2) may be capacitance the terminals for MClk+ and MClk− at least during time period T2.

The adiabatic master-slave flip-flop design presented in FIGS. 5A and 5B can be used a sequential element for adiabatic computing such as registers and pipelined microprocessors.

Figure 6A:
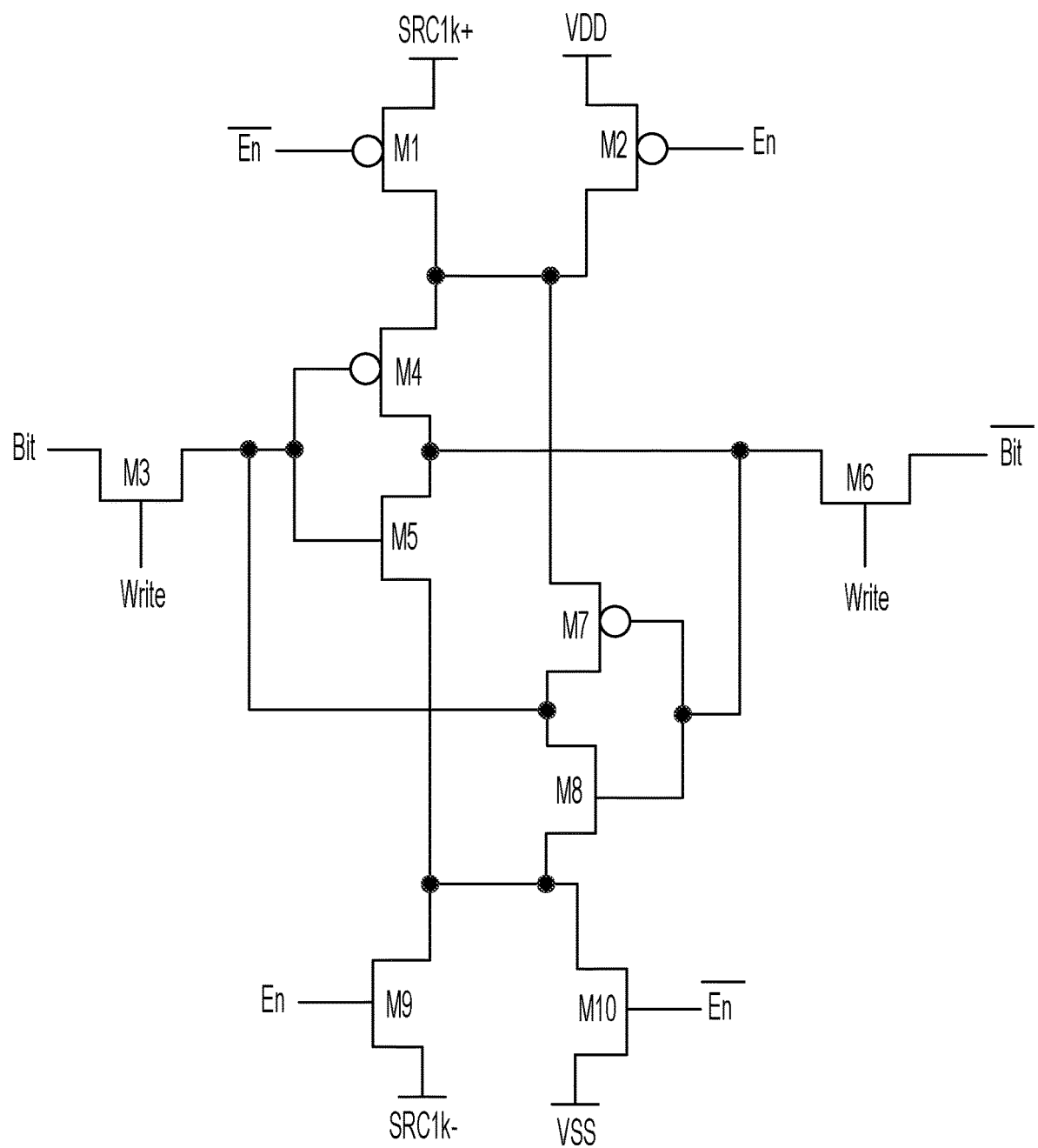
FIG. 6A is a schematic drawing of an adiabatic SRAM cell in accordance with the principles of the present invention.
Figure 6B:
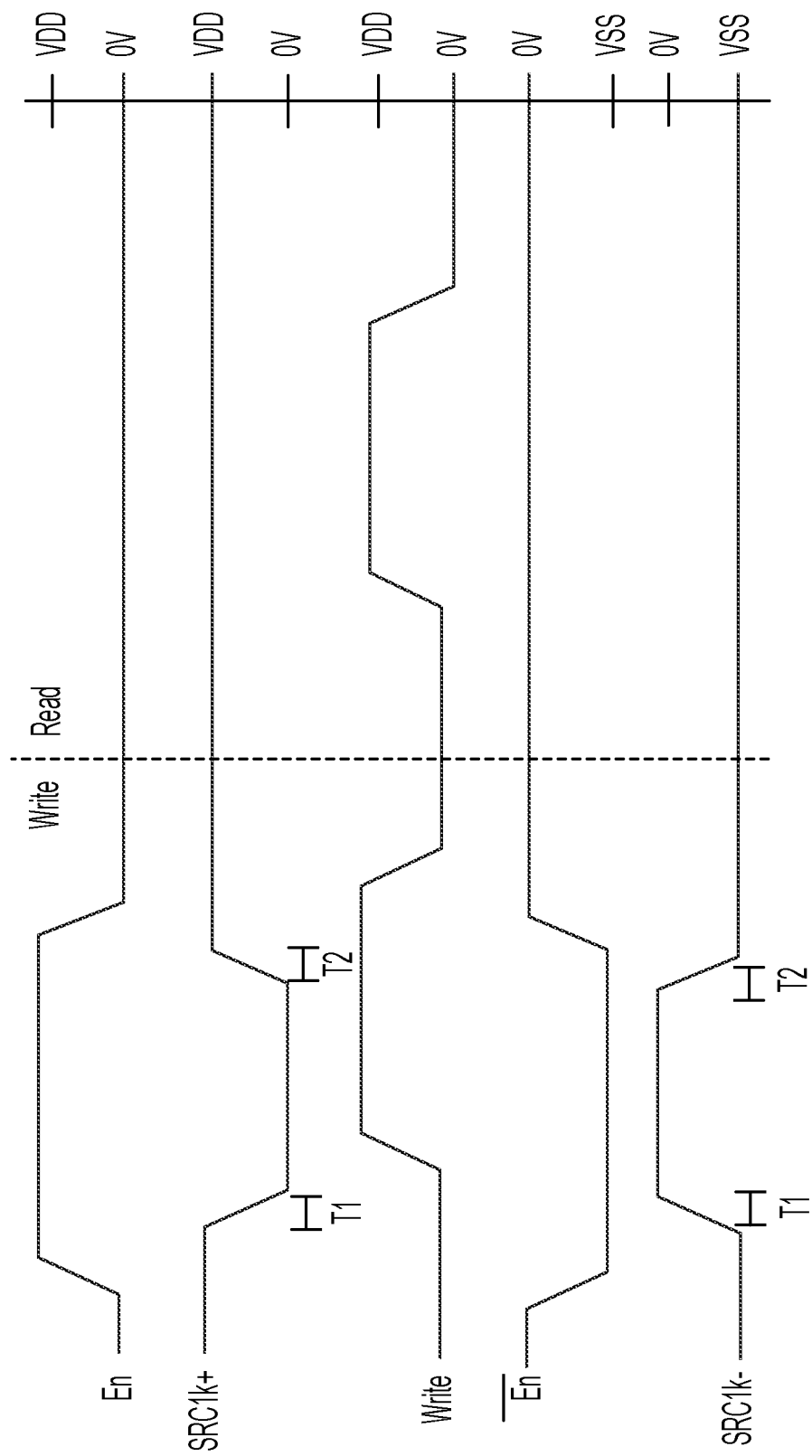
FIG. 6B is a timing diagram, in accordance with the principles of the present invention, for the adiabatic SRAM cell of FIG. 6A.

With reference to FIGS. 6A and 6B, a second sequential element disclosed herein is an adiabatic SRAM cell, a modification of a power-clocked SRAM cell, which can be used as a generic memory element and which can also be used to separate Bennett clocked combinational logic. In a conventional SRAM cell the bit energy stored in the cell is dissipated when new data is written into the cell. In accordance with the principles described herein, if new data is to be written, an energy recovery step is executed using the power clock signals SRClk+ and SRClk−. This is accomplished by adding select transistors into the power lines of the cell, namely, transistors M1, M2, M9, and M10 in FIG. 6A. If new data is to be written, and external logic circuit (not shown) generates Enable (En and $\overline{En}$) and Write signals, in addition to the power clock signals SRClk+ and SRClk−, as shown in FIG. 6B. The external logic circuit used with the adiabatic SRAM cell may be, at least in part, different than the external logic circuit used with the adiabatic master-slave flip-flop described above. For example, in this example, the external logic circuit may generate the power clock signals SRClk+ and SRClk−, the enable signals En and $\overline{En}$, and the Write signal. However, this is not to be construed in a limiting sense.

In some non-limiting embodiments or examples, the external logic circuit used with the adiabatic SRAM cell and/or the external logic circuit used with the adiabatic master-slave flip-flop is/are designed or configured to not only provide the signals shown, for example, in FIGS. 5B and 6B, but also to recover electrical charge or energy returned to the external logic circuit as described herein.

The enable signals En and $\overline{En}$ applied to transistors M2, M9 and M1, M10, respectively, connect the cell comprised of transistors M4, M5, M7, and M8, to the power clock signals SRClk+ and SRClk−, whereupon, as these power clock signals, over time period T1, ramp from VDD and VSS, respectively, to a null value, e.g., 0 volts, energy from the SRAM cell is at least partially recovered by the external logic circuit until the transistors M4, M5, M7, and M8 reach cut-off. Thus, it is during time period T1, that at least part of the electrical charge or energy residing in the cell comprised of transistors M4, M5, M7, and M8 is recovered by return of the electrical charge or energy to the external logic circuit that generates SRClk+ and SRClk−.

The remaining, trapped, energy in the cell will be dissipated when new data is written into the cell. When the power clock signals SRClk+ and SRClk− are at the null value, the Write signal is asserted (e.g., to VDD), whereupon the new data is applied to the cell from the bit lines Bit and $\overline{\text{Bit}}$. Then, over time period T2, the power clock signals SRClk+ and SRClk− ramp back to VDD and VSS, respectively, to store the data in the cell. The enable signals En and $\overline{\text{En}}$ and Write signal are then released (i.e., returned to their starting values), whereupon the cell comprised of transistors M4, M5, M7, and M8 is then connected to the static power lines VDD and VSS and the data stored in the cell is held. Finally, the Write signal is de-asserted to its starting value. (e.g., 0 volts). In this example, the adiabatic power clock signals SRClk+ and SRClk− are used only to erase the cell before a new write of information.

As shown in FIG. 6A, the adiabatic SRAM cell is comprised of ten transistors. Transistors M1, M2, M4, and M7 are p-channel MOSFETs; while transistors M3, M5, M6, M8, M9, and M10 are n-channel MOSFETs. Transistors M1, M2, M9, and M10 allow the SRAM cell to switch between the DC power supplies and the adiabatic power clock signals SRClk+ and SRClk−. The DC power supplies VDD and VSS are used to retain information when the SRAM cell is operated in Read mode or operation as shown in FIG. 6B. Transistors M4, M5, M7, and M8 comprise a two-inverter latch of the SRAM cell that retains information between cycles. Transistors M3 and M6 connect the SRAM cell to the data, e.g., a logical "1" or "0", on the input Bit and the complimentary data on the input $\overline{\text{Bit}}$.

As shown in FIG. 6B, when the SRAM cell is to be written during a Write operation, the first signal to change is enable En and its complement $\overline{\text{En}}$. This will turn off transistors M2 and M10, while turning on transistors M1 and M9. Once the signals En and $\overline{\text{En}}$ are valid, then the SRAM adiabatic power clock signals SRClk+ and SRClk− are ramped over time period T1 from VDD and VSS to a null state, e.g., 0 volts, erasing the information or data stored in the SRAM cell and recovering, by the external logic circuit, of at least a part or a portion of the energy stored in the SRAM cell, in particular, energy is recovered from the cell comprising transistors M4, M5, M7, and M8.

After the SRAM cell is erased and at least part of the stored energy is recovered, then the Write signal ramps up, e.g., from a null value or 0 volts to VDD, turning on transistors M3 and M6. This writes the data at the inputs Bit and $\overline{\text{Bit}}$ into the cell formed by transistors M4, M5, M7 and M8. Next, over the time period T2, the adiabatic power clock signals SRClk+ and SRClk− are returned to their valid states VDD and VSS.

Finally, the SRAM cell can be placed back into read mode by ramping down the enable signal En to the null value, e.g., 0 volts, and ramping up the $\overline{\text{En}}$ signal to the null value, e.g., 0 volts, effectively switching from the adiabatic power clock signals SRClk+ and SRClk− to the DC power supplies VDD and VSS. The Write signal may then return to 0 volts, whereupon the logic data, e.g., "1" or "0", at the inputs Bit and $\overline{\text{Bit}}$ will be stored in the SRAM cell and, more particularly, in the cell comprised of transistors M4, M5, M7, and M8.

During a Read cycle, as seen in FIG. 6B, the En signal stays at 0V preventing the SRAM cell from losing its information. During a read operation, the Write signal is used to pass the bit of information stored in the SRAM cell to lines Bit and $\overline{\text{Bit}}$. The read cycle has the same operation as a conventional SRAM cell, and the adiabatic power clock signals SRClk+ and SRClk− are not required. The adiabatic power clock signals SRClk+ and SRClk− can be periodic signals but they are only needed to erase the SRAM cell. If the SRAM cell is only used for read operations, the En and $\overline{\text{En}}$ signals are not asserted and the information stored in the SRAM cell is preserved, therefore the periodic signals SRClk+ and SRClk− won't affect the information in the cell. Therefore, since the adiabatic power clock signals SRClk+ and SRClk− will have no effect during the Read operation, they can simply stay at VDD and VSS respectively as shown in FIG. 6B.

In some non-limiting embodiments or examples, the value of T in equation (2) above, which can represent time period(s) T1 and/or T2 in the above SRAM cell example, may be tuned or selected such that the value of the inverse of RC/T, i.e., T/RC, is between 2-5000, or is between 2-100, or is between 2-50. However, this is not to be construed in a limiting sense since the value of T, i.e., time period(s) T1 and/or T2 in the above SRAM cell example, may be tuned or selected to be any suitable and/or desirable value deemed suitable and/or desirably by one of ordinary skill in the art, e.g., for a particular application and/or based on practicable considerations in the design of the external logic circuit. In an example, the larger the value of T/RC is, the more energy is recovered by the external logic circuit and the less energy is dissipated by the SRAM cell shown in FIG. 6A, in particular transistors M4, M5, M7 and M8 of the SRAM cell shown in FIG. 6A.

With regard to the example SRAM cell shown in FIG. 6A and the variables R and C in equation (2) above, the value of R in equation (2) may be the resistance between the terminals for SRClk+ and SRClk− at least during time period T1 and the value of C in equation (2) may be capacitance between the terminals for SRClk+ and SRClk− at least during time period T1. An adiabatic SRAM cell described above can be used in memory elements for adiabatic computing, such as register files.

Although the invention has been described in detail for the purpose of illustration based on what is currently considered to be the most practical non-limiting embodiments or examples, it is to be understood that such detail is solely for that purpose and that the invention is not limited to the disclosed non-limiting embodiments or examples, but, on the contrary, is intended to cover modifications and equivalent arrangements that are within the spirit and scope of the following claims. For example, it is to be understood that the present invention contemplates that, to the extent possible, one or more features of any non-limiting embodiment or example can be combined with one or more features of any other non-limiting embodiment or example.

The invention claimed is:

1. A method comprising:
   (a) in a computer storage element having first and second power inputs separated by an array of transistors of the computer storage element configured for storing a computer bit of data, applying to an input of the array of transistors a logic value "1" or "0";
   (b) concurrent with step (a), applying to the first power input a first clock signal having a leading edge that changes from a null value to VDD, or vice versa, over a time period T1;
   (c) concurrent with step (b), applying to the second power input a second clock signal having a leading edge that changes from the null value to VSS, or vice versa, over the time period T1, whereupon the logic value applied to the input of the array of transistors is stored in the array of transistors;

(d) following step (c), causing the first clock signal to change from VDD to the null value, or vice versa, over a time period T2; and (e) concurrent with step (d), causing the second clock signal to change from VSS to the null value, or vice versa, over the time period T2, whereupon a portion or part of electrical charge or energy associated with the logic value stored in the array of transistors is provided to circuitry that generates the first clock signal, the second clock signal, or both the first and second clock signals, wherein the value of time period T1, or time period T2, or both time periods T1 and T2 is/are greater than a product of RC, where R is resistance associated with the computer storage element, and C is a load capacitance associated with the computer storage element.

2. A method comprising:

(a) in a computer storage element having first and second clock inputs separated by an array of transistors of the computer storage element storing a first bit of data applied to a bit input, applying to the first clock input a first clock signal having a leading edge that changes from a null value to VDD, or vice versa, over a time period T1;

(b) concurrent with step (a), applying to the second clock input a second clock signal having a leading edge that changes from the null value to VSS, or vice versa, over the time period T1, whereupon a portion or part of electrical charge or energy associated with the first bit of data stored in the array of transistors is provided to circuitry that generates the first clock signal, the second clock signal, or both the first and second clock signals;

(c) following step (b), causing a second bit of data to be stored in the array of transistors; and (d) following step (c), causing, over the time period T2, the first clock signal to return from VDD back to the null value, or vice versa, and the second clock signal to return from VSS back to the null value, or vice versa, whereupon the logic value applied to the bit input is stored in the array of transistors, wherein the value of time period T1, or time period T2, or both time periods T1 and T2 is/are greater than a product of RC, where R is resistance associated with computer storage element, and C is a load capacitance associated with computer storage element.

* * * * *